US009059091B2

(12) United States Patent
Guo et al.

(10) Patent No.: US 9,059,091 B2
(45) Date of Patent: *Jun. 16, 2015

(54) TRANSISTOR HAVING REPLACEMENT METAL GATE AND PROCESS FOR FABRICATING THE SAME

(71) Applicant: International Business Machines Corporation, Armonk, NY (US)

(72) Inventors: Dechao Guo, Hopewell Junction, NY (US); Keith Kwong Hon Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/041,840

(22) Filed: Sep. 30, 2013

(65) Prior Publication Data

US 2014/0035068 A1   Feb. 6, 2014

Related U.S. Application Data

(63) Continuation of application No. 12/880,085, filed on Sep. 11, 2010, now Pat. No. 8,653,602.

(51) Int. Cl.
*H01L 21/8238* (2006.01)
*H01L 21/28* (2006.01)
(Continued)

(52) U.S. Cl.
CPC .... *H01L 21/28079* (2013.01); *H01L 21/28185* (2013.01); *H01L 21/823842* (2013.01);
(Continued)

(58) Field of Classification Search
CPC ................... H01L 21/28079; H01L 21/28185; H01L 21/823842; H01L 21/823857; H01L 29/42372; H01L 29/517; H01L 29/66553; H01L 29/66583

USPC ........... 257/288, 388, 407, E21.19, E29.158; 438/199, 592

See application file for complete search history.

(56) References Cited

U.S. PATENT DOCUMENTS 6,303,963 B1   10/2001   Ohtani et al.
6,376,347 B1 *  4/2002   Ohmura et al. ............... 438/585
(Continued)

FOREIGN PATENT DOCUMENTS

EP         2112686 A2    10/2009
JP       2007-329237    12/2007
(Continued)

OTHER PUBLICATIONS

International Search Report and Written Opinion in counterpart PCT patent application PCT/EP2011/064240, dated Sep. 19, 2011.
(Continued)

*Primary Examiner* — Jose R Diaz
(74) *Attorney, Agent, or Firm* — Vazken Alexanian

(57) ABSTRACT

A transistor is fabricated by removing a polysilicon gate over a doped region of a substrate and forming a mask layer over the substrate such that the doped region is exposed through a hole within the mask layer. An interfacial layer is deposited on top and side surfaces of the mask layer and on a top surface of the doped region. A layer adapted to reduce a threshold voltage of the transistor and/or reduce a thickness of an inversion layer of the transistor is deposited on the interfacial layer. The layer includes metal, such as aluminum or lanthanum, which diffuses into the interfacial layer, and also includes oxide, such as hafnium oxide. A conductive plug, such as a metal plug, is formed within the hole of the mask layer. The interfacial layer, the layer on the interfacial layer, and the conductive plug are a replacement gate of the transistor.

16 Claims, 5 Drawing Sheets

(51) Int. Cl.
*H01L 29/51* (2006.01)
*H01L 29/423* (2006.01)
*H01L 29/66* (2006.01)

(52) U.S. Cl.
CPC ...... *H01L21/823857* (2013.01); *H01L 29/517* (2013.01); *H01L 29/66545* (2013.01); *H01L 29/42372* (2013.01)

(56) References Cited

U.S. PATENT DOCUMENTS

| | | | |
|---|---|---|---|
| 6,645,818 B1 | 11/2003 | Sing et al. | |
| 6,664,154 B1 | 12/2003 | Bell et al. | |
| 6,908,801 B2 * | 6/2005 | Saito | 438/199 |
| 7,242,055 B2 | 7/2007 | Bojarczuk, Jr. et al. | |
| 7,390,709 B2 | 6/2008 | Doczy et al. | |
| 8,129,795 B2 | 3/2012 | Datta et al. | |
| 8,653,602 B2 * | 2/2014 | Guo et al. | 257/369 |
| 2001/0027005 A1 | 10/2001 | Moriwaki et al. | |
| 2006/0081939 A1 | 4/2006 | Akasaka et al. | |
| 2007/0037343 A1 | 2/2007 | Colombo et al. | |
| 2007/0138578 A1 | 6/2007 | Callegari et al. | |
| 2009/0127632 A1 | 5/2009 | Pas | |
| 2009/0179285 A1 | 7/2009 | Wood et al. | |
| 2009/0189201 A1 | 7/2009 | Chang et al. | |
| 2010/0127336 A1 | 5/2010 | Chambers et al. | |
| 2010/0193872 A1 | 8/2010 | Carter et al. | |
| 2012/0061772 A1 | 3/2012 | Guo | |

FOREIGN PATENT DOCUMENTS

| | | |
|---|---|---|
| JP | 2008-306051 | 12/2008 |
| JP | 2009-164207 | 7/2009 |
| JP | 2010171137 A | 5/2010 |
| JP | 2010-161308 | 7/2010 |
| JP | 2010-171137 | 8/2010 |
| WO | 2006028690 A1 | 3/2006 |

OTHER PUBLICATIONS

Non-final office action for U.S. Appl. No. 12/880,085 dated Jan. 2, 2013, 15 pp.

Final office action for U.S. Appl. No. 12/880,085 dated Jun. 20, 2013, 10 pp.

Notice of allowance for U.S. Appl. No. 12/880,085 dated Oct. 4, 2013, 10 pp.

* cited by examiner

TRANSISTOR HAVING REPLACEMENT METAL GATE AND PROCESS FOR FABRICATING THE SAME

RELATED APPLICATIONS

The present patent application is a continuation of the previously filed patent application having the same title, filed on Sep. 11, 2010, and assigned patent application Ser. No. 12/880,085.

BACKGROUND

Transistors are semiconductor devices that are commonly found in a wide variety of integrated circuits. A transistor is basically a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Traditionally, the gates of transistors have been polysilicon gates. Transistors having polysilicon gates are relatively easy to fabricate, and the operating effects of transistors having polysilicon gates are well known. However, as power consumption and operating speeds of integrated circuits that include transistors are optimized, more recently the gates of transistors have been metal gates.

A transistor having a metal gate can be fabricated in two general ways. A polysilicon gate can first be fabricated, and then replaced with a metal gate during subsequent semiconductor processing. This approach is known as a "gate last" approach, and the metal gate is considered a damascene or replacement gate, insofar as the metal gate replaces a polysilicon gate. A second approach fabricates the metal gate without first fabricating a polysilicon gate, and is known as a "gate first" approach.

BRIEF SUMMARY

A method of an embodiment of the invention is for fabricating a transistor. The method removes a polysilicon gate over a doped region of a substrate and forms a mask layer over the substrate such that the doped region is exposed through a hole within the mask layer. The method deposits an interfacial layer on top and side surfaces of the mask layer and on a top surface of the doped region exposed through the hole. The method deposits a layer on the interfacial layer adapted to one or more of: reducing a threshold voltage of the transistor and reducing a thickness of an inversion layer of the transistor. The method forms a conductive plug within the hole of the mask layer. The interfacial layer, the layer on the interfacial layer, and the conductive plug together are a replacement gate of the transistor.

A method of another embodiment of the invention is also for fabricating a transistor. The method removes a first polysilicon gate over a p-doped region of a substrate, removes a second polysilicon gate over an n-doped region of the substrate, and forms a mask layer over the substrate such that the p-doped region and the n-doped region are exposed through holes within the mask layer. The method covers the hole through which the n-doped region is exposed within the mask layer with a first temporary layer. While the hole through which the n-doped region is exposed within the mask layer is covered with the first temporary layer, the method deposits a first interfacial layer on top and side surfaces of the mask layer and on a top surface of the p-doped region exposed through the hole. While the hole through which the n-doped region is exposed within the mask layer is covered with the first temporary layer, the method also deposits a first layer on the first interfacial layer adapted to one or more of: reducing a threshold voltage of the transistor and reducing a thickness of an inversion layer of the transistor. The method removes the first temporary layer, and covers the hole through which the p-doped region is exposed within the mask with a second temporary layer.

While the hole through which the p-doped region is exposed within the mask layer is covered with the second temporary layer, the method deposits a second interfacial layer on top and side surfaces of the mask layer and on a top surface of the n-doped region exposed through the hole. While the hole through which the p-doped region is exposed within the mask layer is covered with the second temporary layer, the method also deposits a second layer on the second interfacial layer adapted to one or more of: reducing the threshold voltage of the transistor and reducing the thickness of the inversion layer of the transistor, the second layer being different than the first layer. The method removes the second temporary layer, and forms a conductive plug within each hole of the mask layer. The first interfacial layer, the first layer on the first interfacial layer, and the conductive plug within the hole through which the p-doped region is exposed are a first replacement gate for the p-doped region of the transistor. The second interfacial layer, the second layer on the second interfacial layer, and the conductive plug within the hole through which the n-doped region is exposed are a second replacement gate for the n-doped region of the transistor.

A method of still another embodiment of the invention is also for forming a transistor. The method forms vertical spacers on side surfaces of a polysilicon gate over the doped region. The method replaces a portion of the doped region at a side of each vertical spacer beginning at the top surface of the doped region with silicide. The method forms a mask layer over the substrate and over the polysilicon gate, the mask layer including nitride. The method etches the mask layer to expose the polysilicon gate, and removes the polysilicon gate. The method deposits an interfacial layer on top and side surfaces of the mask layer and on a top surface of the doped region exposed through the hole. The method deposits a layer on the interfacial layer adapted to one or more of: reducing a threshold voltage of the transistor and reducing a thickness of an inversion layer of the transistor. The method deposits a work function metal within the hole of the mask layer, and deposits a second metal over the work function metal within the hole of the mask layer. The work function metal and the second metal are a conductive plug. The interfacial layer, the layer on the interfacial layer, and the conductive plug together are a replacement gate of the transistor.

A semiconductor transistor device of an embodiment of the invention includes a substrate, a doped region within and exposed through the substrate, a mask layer over the substrate, and a replacement metal gate within the mask layer and over the doped region. The replacement metal gate includes an interfacial layer adjacent to side surfaces of the mask layer and to a top surface of the doped region. The replacement metal gate also includes a layer at least partially diffused into the interfacial layer, to one or more of: reduce a threshold voltage of the transistor and reduce a thickness of an inversion layer of the semiconductor transistor device.

A semiconductor transistor device of another embodiment of the invention includes a substrate, a p-doped region within and exposed through the substrate, an n-doped region within and exposed through the substrate, a mask layer over the substrate. The semiconductor transistor device also includes a first replacement metal gate within the mask layer and over the p-doped region, and a second replacement metal gate within the mask layer and over the n-doped region. The first replacement metal gate includes a first interfacial layer adjacent to side surfaces of the mask layer and to a top surface of the p-doped region, and a first layer at least partially diffused into the first interfacial layer, to one or more of: reduce a threshold voltage of the transistor and reduce a thickness of an inversion layer of the semiconductor transistor device. The second replacement metal gate includes a second interfacial layer adjacent to side surfaces of the mask layer and to a top surface of the n-doped region, and a second layer at least partially diffused into the second interfacial layer, to one or more of: reduce the threshold voltage of the transistor and reduce the thickness of an inversion layer of the semiconductor transistor device. The second layer is different than the first layer.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

As stated in the background section, more recently transistors that have metal gates instead of polysilicon gates have begun to be fabricated. Fabricating a transistor having a metal gate is generally more difficult than fabricating a transistor having a polysilicon gate. More particularly, fabricating a transistor having a replacement metal gate is more difficult than fabricating a transistor having a polysilicon gate.

Embodiments of the invention are directed to fabricating a transistor having a replacement metal gate. Embodiments of the invention provide for such a fabrication process in which the threshold voltage of the resulting transistor and the thickness of the resulting transistor's inversion layer are both reduced. As such, an integrated circuit employing the inventive transistor consumes less power and operates at a higher frequency than a comparable integrated circuit employing an existing transistor.

Figure 1A:
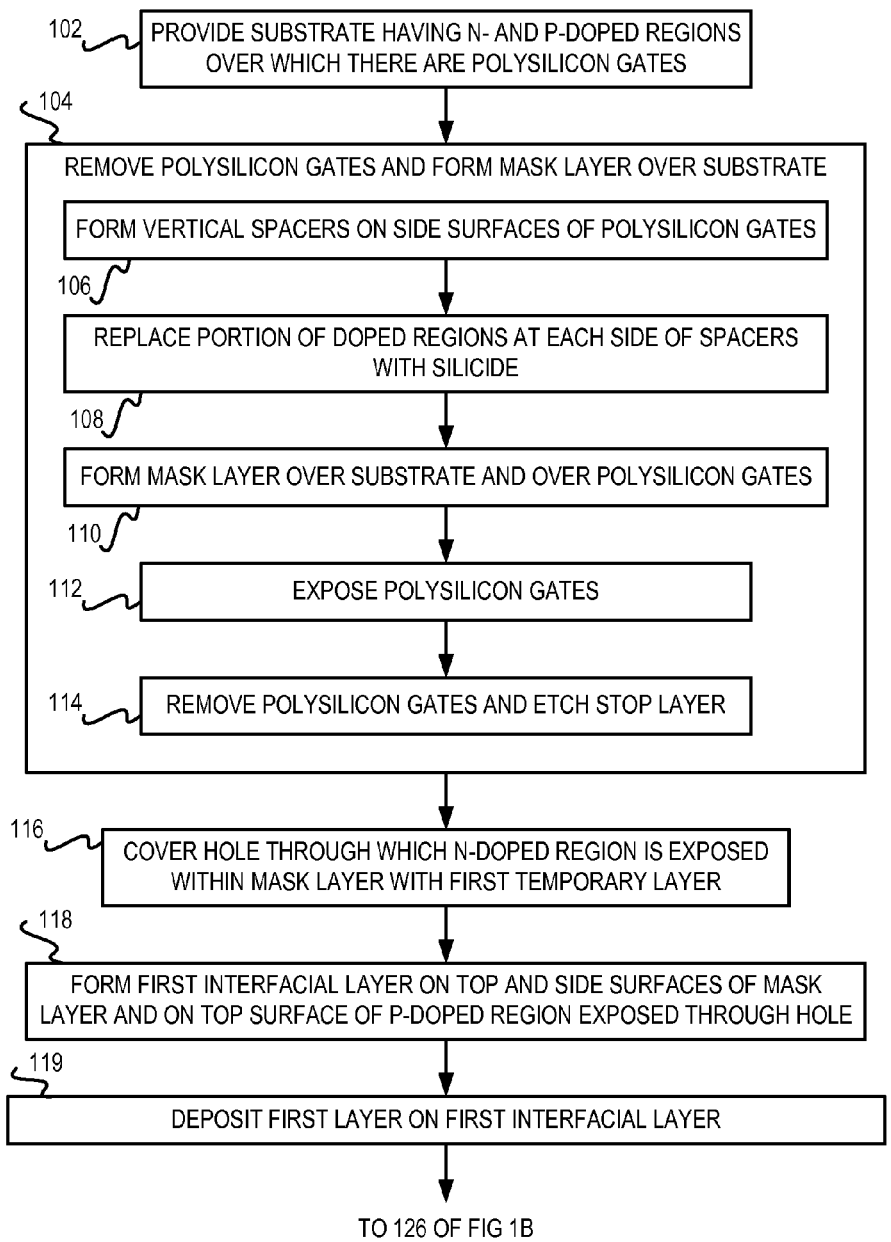
FIG. 1A is a flowchart of a first portion of a method for fabricating a transistor having replacement metal gates, according to an embodiment of the invention.
Figure 1B:
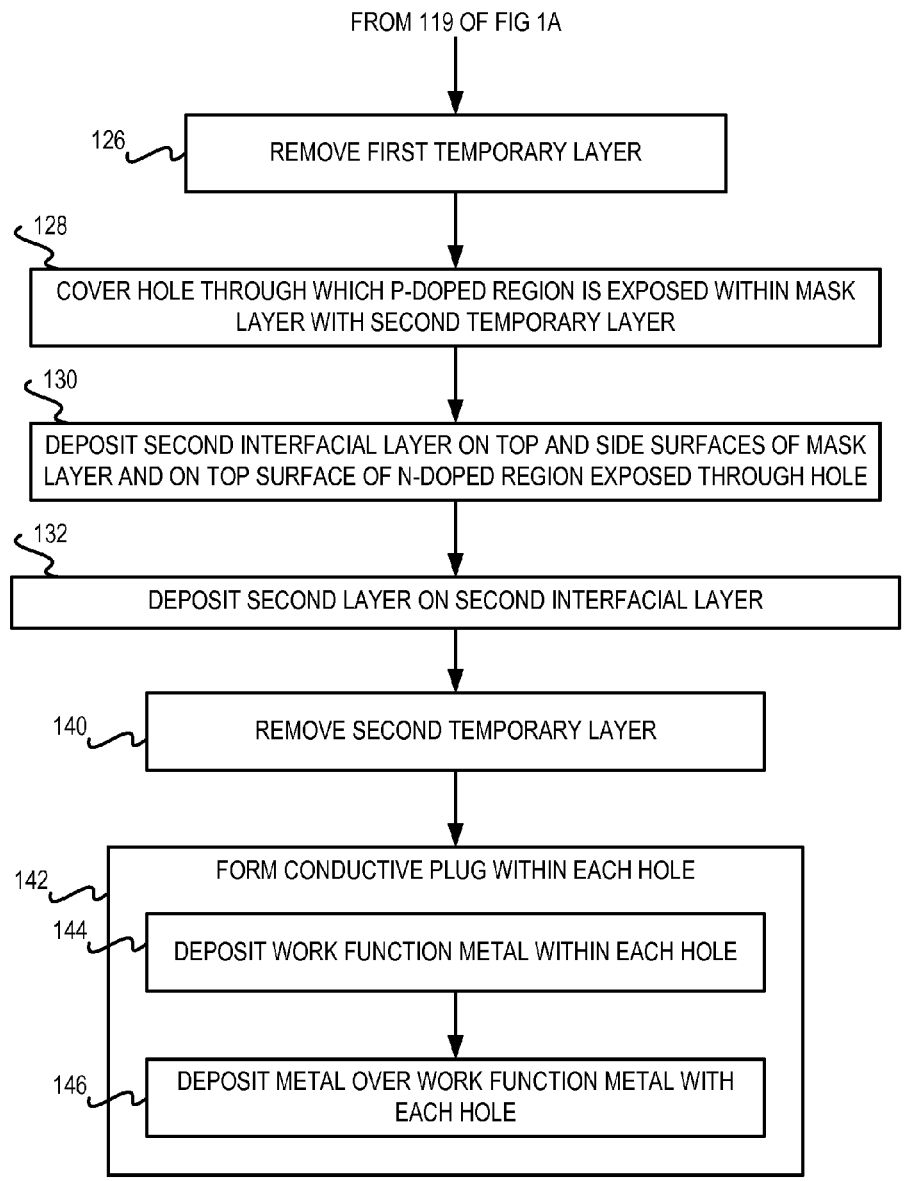
FIG. 1B is a flowchart of a second portion of a method for fabricating a transistor having replacement metal gates, according to an embodiment of the invention.

FIGS. 1A and 1B show a first portion and a second portion, respectively, of a method 100 for fabricating a semiconductor transistor device, according to an embodiment of the invention. A substrate is provided within which there is a p-doped region and an n-doped region, over which there are polysilicon gates (102). The substrate itself may be polysilicon as well in one embodiment. The gates are for the transistor. The substrate, including the doped regions and the polysilicon gates over the doped region, may be formed conventionally. In one embodiment, there is further an etch stop layer between the gates and the substrate.

Figure 2A:
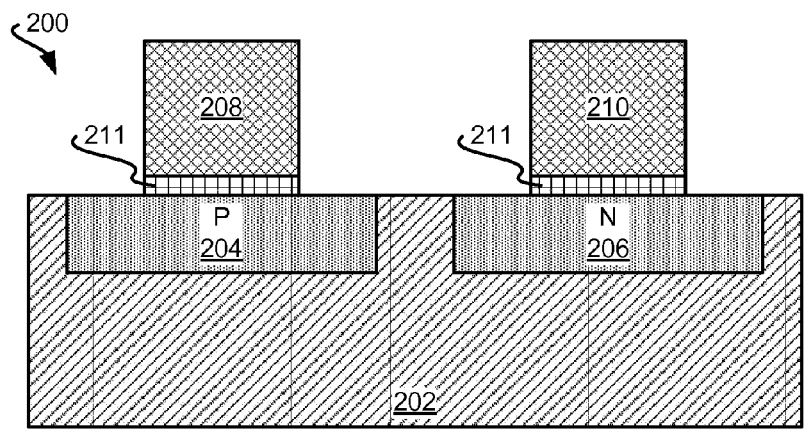
FIG. 2A is a diagram of a representative transistor after part 102 of FIG. 1A has been performed, according to an embodiment of the invention.

FIG. 2A shows a portion of a representative transistor 200 after part 102 has been performed, according to an embodiment of the invention. The transistor 200 can also be referred to as a semiconductor transistor device. The transistor 200 includes a substrate 202 and, within the substrate 202, a p-doped region 204 and an n-doped region 206. There is a polysilicon gate 208 over the p-doped region 204, and a polysilicon gate 210 over the n-doped region 206. Furthermore, there is an etch stop layer 211 between the polysilicon gates 208 and 210 and the substrate 202. The etch stop 211 layer may be silicon oxide or silicon nitride in one embodiment.

Referring back to FIG. 1A, the polysilicon gates are removed from the substrate and a mask layer is formed over the substrate such that the doped regions are exposed through corresponding holes within the mask layer (104). In one embodiment, part 104 may be performed as follows. Vertical spacers are formed on side surfaces of the polysilicon gates (106). The vertical spacers may be silicon nitride, silicon oxynitride, silicon oxide, or another material; however, the vertical spacers and the etch stop layer have to be of different materials. The vertical spacers can be formed by depositing a layer over the substrate and the polysilicon gates, and then etching the layer so that just the layer on the side surfaces of the polysilicon gates remains.

A portion of the doped regions are replaced with silicide at each side of the spacers (108). The purpose of the silicide is to lower the contact resistance between the source and drain of the transistor and a subsequently formed contact. Part 108 can be etching the exposed doped regions, and then depositing silicide in the spaces created. The mask layer is then formed over the substrate and over the polysilicon gates (110), and the transistor being formed is subjected to chemical-mechanical planarization (CMP) to remove the mask layer from the top surfaces of the polysilicon gates (112). The mask layer may be silicon oxide or nitride. The polysilicon gates and the etch stop layer are then removed (114).

Figure 2B:
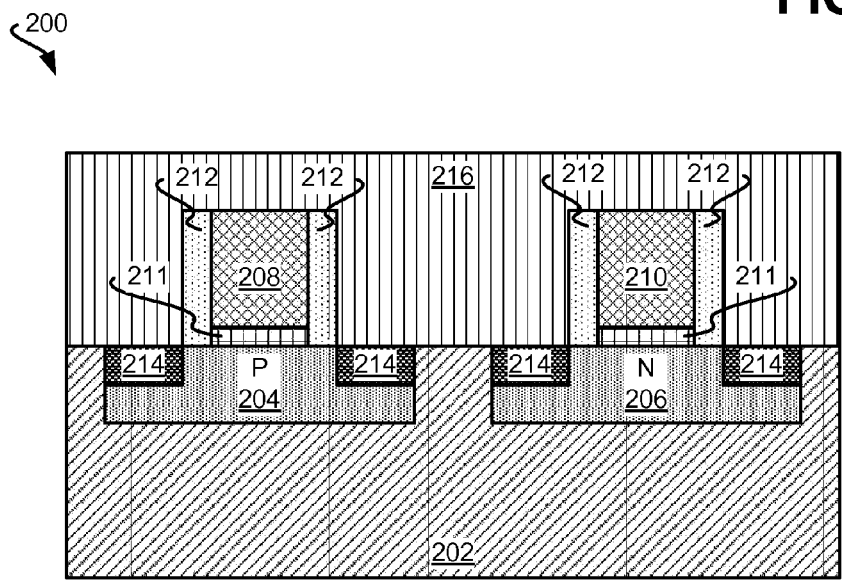
FIG. 2B is a diagram of a representative transistor after parts 106, 108, and 110 of FIG. 1A have been performed, according to an embodiment of the invention.

FIG. 2B shows a portion of the transistor 200 after parts 106, 108, and 110 have been performed, according to an embodiment of the invention. Vertical spacers 212 have been formed on the side surfaces of the polysilicon gates 208 and 210. Portions of the p-doped region 204 and the n-doped region 206 at sides of the spacers 212 have been replaced with silicide 214. A mask layer 216, such as nitride, has been deposited over the substrate 202 and the polysilicon gates 210.

Figure 2C:
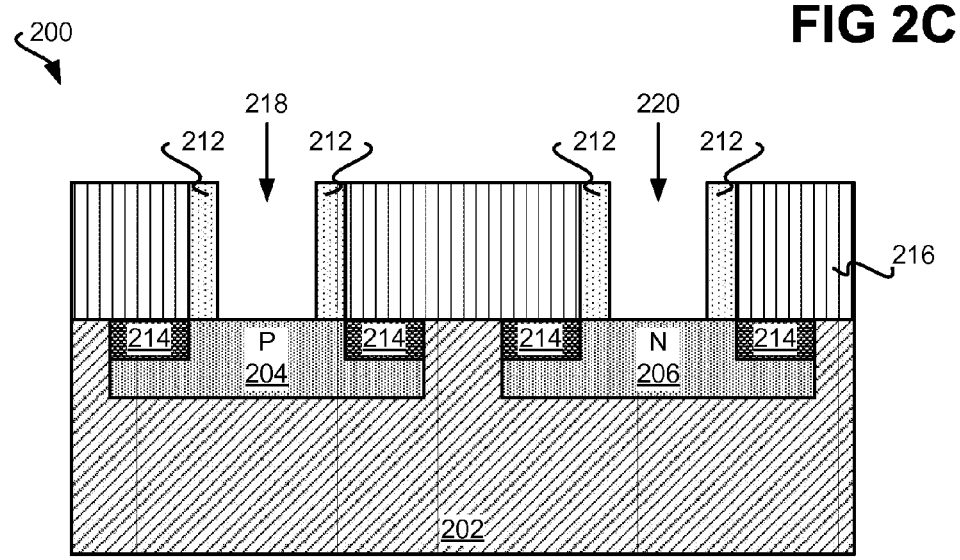
FIG. 2C is a diagram of a representative transistor after parts 112 and 114 of FIG. 1A have been performed, according to an embodiment of the invention.

FIG. 2C shows a portion of the transistor 200 after parts 112 and 114 have been performed, according to an embodiment of the invention. The transistor 200 has been subjected to CMP to expose the polysilicon gates 210, and the polysilicon gates 210 have been removed, such by etching until the etch stop layer 211 has been reached. Holes 218 and 220 are formed where the polysilicon gates 210 were. The hole 218 corresponds to and exposes the p-doped region 204 through the mask layer 216, whereas the hole 220 corresponds to and exposes the n-doped region 206 through the mask layer 216. The etch stop layer 211 exposed within the holes 218 and 220 is removed, because the layer 211 is no longer needed.

Referring back to FIG. 1A, the hole through which the n-doped region is exposed within the mask layer is covered with a first temporary layer (116). A first interfacial layer is then formed on the top and side surfaces of the mask layer, and on the top surface of the p-doped region exposed through its corresponding hole (118). The interfacial layer may be silicon oxide, silicon oxynitride, or another material. The interfacial layer can be formed during a substrate surface treatment process, such as thermal oxidation, plasma nitridation, or deposition. A first layer is then deposited on the first interfacial layer (119).

The first layer can be deposited on the first interfacial layer in part 119 in three different ways. First, a metal or metal oxide layer, followed by a high-k dielectric layer, can be deposited on the first interfacial layer. The metal or metal oxide layer and the high-k layer together are considered the first layer that is deposited on the first interfacial layer. The metal or metal oxide layer may be lanthanum, lutetium, lanthanum oxide, or lutetium oxide, among other metals and among other metal oxides, and the high-k dielectric layer may be hafnium oxide, titanium oxide, or zirconium oxide, among other high-k dielectrics.

Second, a high-k dielectric layer, followed by a metal or metal oxide layer, can be deposited on the first interfacial layer. The high-k dielectric layer and the metal or metal oxide layer together are considered the first layer that is deposited on the first interfacial layer. As before, the metal or metal oxide layer may be lanthanum, lutetium, lanthanum oxide, or lutetium oxide, among other metals and among other metal oxides, and the high-k dielectric layer may be hafnium oxide, titanium oxide, or zirconium oxide, among other high-k dielectrics.

Third, a layer of a high-k dielectric material in which metal has been mixed can be deposited on the first interfacial layer. As before, the metal may be lanthanum or lutetium, among other metals, and the high-k dielectric layer in which the metal is mixed may be hafnium oxide, titanium oxide, or zirconium oxide, among other high-k dielectrics. In all three ways, the metal diffuses into the first interfacial layer.

The metal diffused into the first interfacial layer provides the resulting semiconductor transistor device with a lower threshold voltage, and with a thinner inversion layer. It has been found that by depositing a metal layer onto the first interfacial layer, or by a depositing a metal oxide layer onto the first interfacial layer, the metal diffuses into the interfacial layer, and the resulting metal-impregnated interfacial layer is what reduces the semiconductor device's threshold voltage and inversion layer thickness.

Figure 2D:
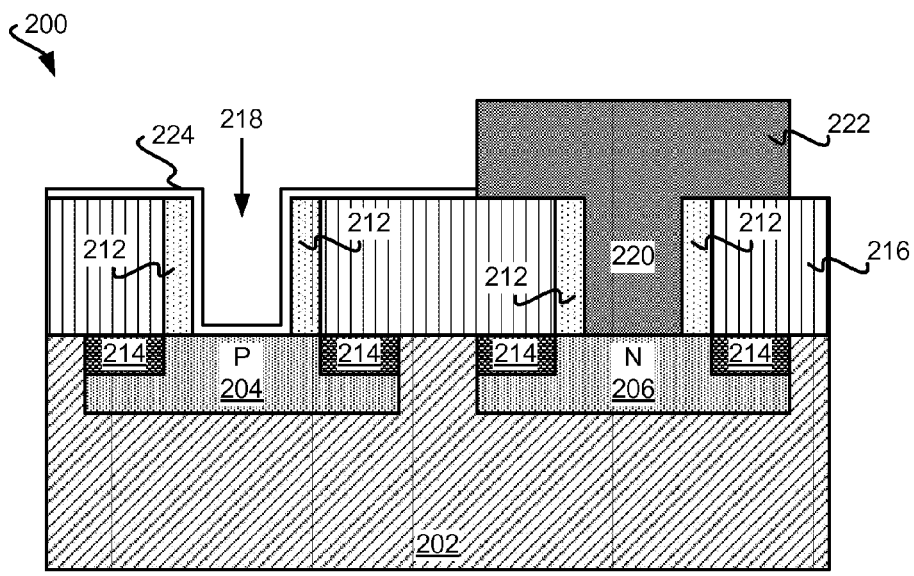
FIG. 2D is a diagram of a representative transistor after parts 116, 118, and 119 of FIG. 1A have been performed, according to an embodiment of the invention.

FIG. 2D shows a portion of the transistor 200 after parts 116, 118, and 119 have been performed, according to an embodiment of the invention. The hole 220 is covered with a first temporary layer 222, which may be silicon oxide. The layer 224 represents both the first interfacial layer and the first layer deposited on the first interfacial layer. Thus, the layer 224 includes the interfacial layer having metal diffused therein, as well as the high-k dielectric layer.

Referring to FIG. 1B, the first temporary layer is removed (126), such as by etching, and the hole through which the p-doped region is exposed within the mask layer is covered with a second temporary layer (128). A second interfacial layer is then deposited on the top and side surfaces of the mask layer, and on the top surface of the n-doped region exposed through its corresponding hole (130). The second interfacial layer may be formed from the same material, and in the same way, as the first interfacial layer, as has been described above in relation to part 118. A second layer is then deposited on the second interfacial layer (132).

The second layer can be deposited on the second interfacial layer in part 132 in any of the same three different ways that the first layer can be deposited on the first interfacial layer in part 119, as has been described above. As such, first, a metal or metal oxide layer, followed by a high-k dielectric layer, can be deposited on the second interfacial layer. The metal or metal oxide layer and the high-k layer together are considered the second layer that is deposited on the second interfacial second. The metal or metal oxide layer may be aluminum or aluminum oxide, among other metals and among other metal oxides, and the high-k dielectric layer may be hafnium oxide, titanium oxide, or zirconium oxide, among other high-k dielectrics.

Second, a high-k dielectric layer, followed by a metal or metal oxide layer, can be deposited on the second interfacial layer. The high-k dielectric layer and the metal or metal oxide layer together are considered the second layer that is deposited on the second interfacial layer. As before, the metal or metal oxide layer may be aluminum or aluminum oxide, among other metals and among other metal oxides, and the high-k dielectric layer may be hafnium oxide, titanium oxide, or zirconium oxide, among other high-k dielectrics.

Third, a layer of a high-k dielectric material in which metal has been mixed can be deposited on the second interfacial layer. As before, the metal may be aluminum, among other metals, and the high-k dielectric layer in which the metal is mixed may be hafnium oxide, titanium oxide, or zirconium oxide, among other high-k dielectrics. In all three ways, the metal diffuses into the second interfacial layer.

It is noted that the metal that is part of the second layer deposited on the second interfacial layer in part 132 is different than the metal that is part of the first layer deposited on the first interfacial layer in part 119. For example, the metal deposited on the first interfacial layer over the p-doped region may be lanthanum or lutetium, whereas the metal deposited on the second interfacial layer over the n-doped region may be aluminum. This is because that the n-field effect transistor (n-FET) and the p-FET have to have opposite charge polarities to reduce their threshold voltages.

Figure 2E:
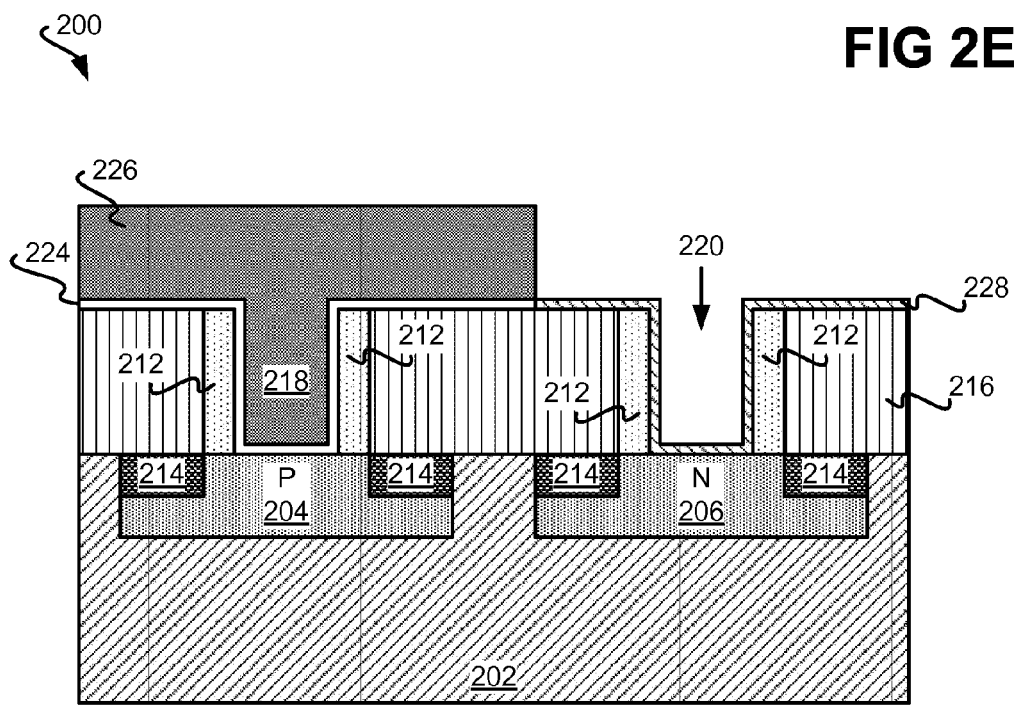
FIG. 2E is a diagram of a representative transistor after parts 126, 128, 130, and 132 of FIG. 1B have been performed, according to an embodiment of the invention.

FIG. 2E shows a portion of the transistor 200 after parts 126, 128, 130, and 132 have been performed, according to an embodiment of the invention. The first temporary layer 222 has been removed, and the hole 218 has been covered with a second temporary layer 226, which may be silicon oxide. The layer 228 represents both the second interfacial layer deposited in part 130 and the second layer deposited on the second interfacial layer in part 132. Thus, the layer 228 includes the interfacial layer having metal diffused therein, as well as the high-k dielectric layer.

Referring back to FIG. 1B, the second temporary is removed (140), and a conductive plug is formed within the hole over each doped region (142). In one embodiment, the conductive plug is formed within each hole by depositing a work function metal within each hole (144), and then depositing metal, such as aluminum, over the work function metal (146). Reactive-ion etching, or another type of etching, may be performed between parts 144 and 146. The semiconductor transistor device may be planarized after part 146, such as by chemical-mechanical polishing. The work function metal may be titanium nitride, and the metal deposited over the work function metal may be aluminum. The purpose of the work function metal is to adjust the threshold voltages for the n-FET and the p-FET. The threshold voltage adjustment resulting from the work function metal is additive to the threshold voltage adjustment resulting from the metal diffusion within the interfacial layers.

It is noted that the conductive plugs, together with the interfacial layers and the first and the second layers deposited on the interfacial layers, make up the replacement gates of the semiconductor transistor device formed by the method 100. The presence of the metal diffused within the interfacial layers, as a result of depositing the first and the second layers on the interfacial layers, imbues the semiconductor transistor device with certain properties, as has been described above. These properties are namely a reduced threshold voltage, and a reduced inversion layer thickness.

Figure 2F:
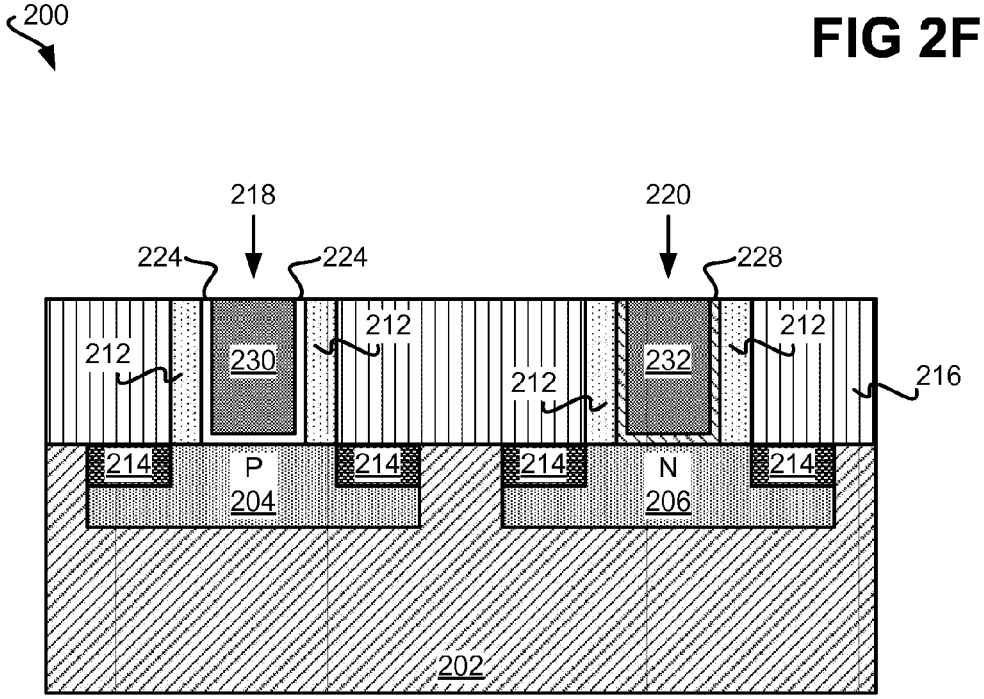
FIG. 2F is a diagram of a representative transistor after parts 140 and 142 of FIG. 1B have been performed, according to an embodiment of the invention.

FIG. 2F shows the transistor 200 after parts 140 and 142 have been performed, according to an embodiment of the invention. The second temporary layer 226 has been removed. A conductive plug 230 has been formed within the hole 218 over the p-doped region 204. Likewise, a conductive plug 232 has been formed within the hole 220 over the n-doped region 206.

The method 100 has been described such that a semiconductor transistor device that has two metal replacement gates is fabricated. However, in other embodiments of the invention, a semiconductor transistor that has just one replacement gate may be fabricated. That is, instead of having two doped regions over which there are replacement gates, there may be just one doped region over which there is a replacement gate.

Finally, it is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A method for fabricating a transistor, comprising:
   forming a mask layer over a substrate;
   removing a polysilicon gate over a doped region of the substrate such that the doped region is exposed through a hole within the mask layer;
   covering the hole through which the doped region is exposed within the mask layer with a temporary layer;
   while the hole through which the doped region is exposed within the mask layer is covered with the temporary layer, depositing an interfacial layer on top and side surfaces of the mask layer and on a top surface of the doped region exposed through the hole, and depositing a layer on the interfacial layer adapted to one or more of: reducing a threshold voltage of the transistor and reducing a thickness of an inversion layer of the transistor;
   removing the temporary layer;
   forming a conductive plug within the hole of the mask layer,
   wherein the interfacial layer, the layer on the interfacial layer, and the conductive plug together are a replacement gate of the transistor.

2. The method of claim 1, wherein depositing the layer on the interfacial layer comprises:
   depositing a metal layer or a metal oxide layer on the interfacial layer, the metal from the metal layer or the metal oxide layer to diffuse into the interfacial layer; and
   depositing a high-k dielectric layer on the metal layer or the metal oxide layer.

3. The method of claim 1, wherein depositing the layer on the interfacial layer comprises:
   depositing a high-k dielectric layer on the interfacial layer; and
   depositing a metal layer or a metal oxide layer on the high-k dielectric layer, the metal from the metal layer or the metal oxide layer to diffuse into the interfacial layer.

4. The method of claim 1, wherein depositing the layer on the interfacial layer comprises:
   depositing a high-k dielectric layer in which metal has been mixed, on the interfacial layer, wherein the metal is to diffuse into the interfacial layer.

5. The method of claim 1, wherein depositing the layer on the interfacial layer results in a metal diffusing into the interfacial layer, the metal comprising one of lanthanum, lutetium, and aluminum.

6. The method of claim 1, wherein forming the conductive plug within the hole of the mask layer comprises:
   depositing a work function metal within the hole of the mask layer; and
   depositing a second metal over the work function metal within the hole of the mask layer.

7. A method for forming a transistor, comprising:
   forming vertical spacers on side surfaces of a polysilicon gate over a doped region of a substrate;
   replacing a portion of the doped region at a side of each vertical spacer beginning at the top surface of the doped region with silicide prior to removal of the polysilicon gate such that the silicide does not replace any portion of the doped region directly under the polysilicon gate, the silicide having a top surface flush with a top surface of the doped region of the substrate, the silicide lowering contact resistance between a source and a drain of the transistor and a contact of the transistor;
   forming a mask layer over the substrate;
   removing the polysilicon gate such that the doped region is exposed through a hole within the mask layer;
   covering the hole through which the doped region is exposed within the mask layer with a temporary layer;
   while the hole through which the doped region is exposed within the mask layer is covered with the temporary layer, depositing an interfacial layer on top and side surfaces of the mask layer and on a top surface of the doped region exposed through the hole, and depositing a layer on the interfacial layer adapted to one or more of: reducing a threshold voltage of the transistor and reducing a thickness of an inversion layer of the transistor;
   depositing a work function metal within the hole of the mask layer;
   removing the temporary layer;

depositing a second metal over the work function metal within the hole of the mask layer, the work function metal and the second metal being a conductive plug, wherein the interfacial layer, the layer on the interfacial layer, and the conductive plug together are a replacement gate of the transistor.

8. The method of claim 7, wherein depositing the layer on the interfacial layer comprises:

depositing a metal layer or a metal oxide layer on the interfacial layer, the metal from the metal layer or the metal oxide layer to diffuse into the interfacial layer; and depositing a high-k dielectric layer on the metal layer or the metal oxide layer.

9. The method of claim 7, wherein depositing the layer on the interfacial layer comprises:

depositing a high-k dielectric layer on the interfacial layer; and depositing a metal layer or a metal oxide layer on the high-k dielectric layer, such that the metal from the metal layer or the metal oxide layer diffuses into the interfacial layer.

10. The method of claim 7, wherein depositing the layer on the interfacial layer comprises:

depositing a high-k dielectric layer in which metal has been mixed, on the interfacial layer, such that the metal diffuses into the interfacial layer.

11. The method of claim 7, wherein depositing the layer on the interfacial layer results in a metal diffusing into the interfacial layer, the metal comprising one of lanthanum, lutetium, and aluminum.

12. A semiconductor transistor device comprising:

a substrate;

a doped region within and exposed through the substrate, the doped region having a first top surface and a center thereof, and a second top surface at sides thereof, the second top surface lower than the first top surface to define notches within the doped region between the first top surface and the second top surface;

vertical spacers over the doped region;

silicide within the notches defined within the doped region, the silicide having a top surface flush with the first top surface of the doped region of the substrate, the silicide lowering contact resistance between a source and a drain of the transistor and a contact of the transistor;

a mask layer over the substrate and having a hole through which the doped region is exposed through the mask layer; and a replacement metal gate within the mask layer and over the doped region, wherein the replacement metal gate comprises:

a conductive plug within the hole of the mask layer;

an interfacial layer adjacent to side surfaces of the mask layer and to a top surface of the doped region; and a layer at least partially diffused into the interfacial layer, to one or more of:

reduce a threshold voltage of the transistor and reduce a thickness of an inversion layer of the semiconductor transistor device.

13. The semiconductor transistor device of claim 12, wherein the layer comprises:

a metal layer or a metal oxide layer; and a high-k dielectric layer.

14. The semiconductor transistor device of claim 13, wherein the metal layer is one of an aluminum layer, a lutetium layer, and a lanthanum layer, the metal oxide layer is one of an aluminum oxide layer, a lutetium oxide layer, and a lanthanum oxide layer, and the high-k dielectric layer is one of a hafnium oxide layer, a titanium oxide layer, and a zirconium oxide layer.

15. The semiconductor transistor device of claim 12, wherein the layer comprises a high-k dielectric material into which a metal has been mixed.

16. The semiconductor transistor device of claim 15, wherein the metal is one of aluminum, lutetium, and lanthanum, and the high-k dielectric material is one of a hafnium oxide, titanium oxide, and zirconium oxide.

* * * * *